United States Patent
Hao et al.

(10) Patent No.: US 10,630,297 B2
(45) Date of Patent: Apr. 21, 2020

(54) OSCILLATOR CIRCUIT AND ASSOCIATED OSCILLATOR DEVICE

(71) Applicant: Artery Technology Co., Ltd., Chongqing (CN)

(72) Inventors: Baotian Hao, Chongqing (CN); Chao Li, Chongqing (CN); Weitie Wang, Chongqing (CN)

(73) Assignee: Artery Technology Co., Ltd., Chongqing (CN)

( * ) Notice: Subject to any disclaimer, the term of this patent is extended or adjusted under 35 U.S.C. 154(b) by 0 days.

(21) Appl. No.: 16/223,125

(22) Filed: Dec. 18, 2018

(65) Prior Publication Data

US 2020/0091917 A1    Mar. 19, 2020

(30) Foreign Application Priority Data

Sep. 19, 2018 (CN) .......................... 2018 1 1095760

(51) Int. Cl.
| | | |
|---|---|---|
| *H03L 1/02* | (2006.01) | |
| *H03B 5/04* | (2006.01) | |
| *G05F 3/20* | (2006.01) | |
| *H03K 3/03* | (2006.01) | |
| *G05F 1/10* | (2006.01) | |
| *H03K 3/011* | (2006.01) | |

(52) U.S. Cl.
CPC ................ *H03L 1/023* (2013.01); *G05F 1/10* (2013.01); *G05F 3/20* (2013.01); *H03B 5/04* (2013.01); *H03K 3/011* (2013.01); *H03K 3/0315* (2013.01)

(58) Field of Classification Search
CPC ....................................................... H03L 1/023
USPC ............................................................ 331/176
See application file for complete search history.

(56) References Cited

U.S. PATENT DOCUMENTS

| | | | | |
|---|---|---|---|---|
| 6,809,603 B1* | 10/2004 | Ho | ....................... | H03K 3/0315 331/175 |
| 6,985,040 B2* | 1/2006 | Kim | ....................... | H03K 3/011 331/116 FE |
| 8,248,176 B2* | 8/2012 | Takano | .................... | G05F 3/242 327/513 |
| 2015/0303928 A1* | 10/2015 | Tang | ........................ | H03L 1/00 331/66 |

* cited by examiner

*Primary Examiner* — Joseph Chang
(74) *Attorney, Agent, or Firm* — Winston Hsu

(57) ABSTRACT

The present invention provides an oscillator circuit and associated oscillator device. The oscillator circuit comprises a negative-temperature-coefficient (NTC) bias current generating circuit and a set of oscillator sub-block circuits. The NTC bias current generating circuit is coupled between a supply voltage and a ground voltage, and is arranged to generate at least one NTC bias current. The set of oscillator sub-block circuits are coupled to each other to form an oscillator. Each oscillator sub-block circuit of the set of oscillator sub-block circuits comprises a plurality of transistors coupled between the supply voltage and a node within the NTC bias current generating circuit, wherein the NTC bias current generating circuit and the aforementioned each oscillator sub-block circuit share at least one transistor in the plurality of transistors.

10 Claims, 2 Drawing Sheets

OSCILLATOR CIRCUIT AND ASSOCIATED OSCILLATOR DEVICE

BACKGROUND OF THE INVENTION

1. Field of the Invention

The present invention relates to an oscillator, and more particularly, to an oscillator circuit and associated oscillator device.

2. Description of the Prior Art

A low-power-consumption oscillator of the related art typically requires multiple sub-blocks, and each sub-block of the multiple sub-blocks consumes power individually, resulting in that the overall power consumption of the low-power-consumption oscillator cannot be further reduced.

Aside from the problem mentioned above, related art techniques still encounter some other problems. For example, regarding characteristics, the low-power-consumption oscillator of the related art is temperature-sensitive. In another example, the low-power-consumption low-drifting oscillator of the related art typically requires at least three types of components including capacitors. Since the characteristics variation of a real capacitor may be large, the frequency of the oscillator is likely to vary tremendously, thereby lowering the overall performance.

Hence, there is a need for a novel architecture, in order to improve the overall performance of an electronic system without introducing a side effect or in a way that less likely to introduce a side effect.

SUMMARY OF THE INVENTION

An objective of the present invention is to provide an oscillator circuit and associated oscillator device, to solve the problem mentioned above.

Another objective of the present invention is to provide an oscillator circuit and associated oscillator device, to reach the optimal performance without introducing a side effect or in a way that less likely to introduce a side effect.

At least one embodiment of the present invention provides an oscillator circuit comprising a negative-temperature-coefficient (NTC) bias current generating circuit and a set of oscillator sub-block circuits. The NTC bias current generating circuit is coupled between a supply voltage and a ground voltage, and is arranged to generate at least one NTC bias current. The set of oscillator sub-block circuits are coupled to each other to form an oscillator. Each oscillator sub-block circuit of the set of oscillator sub-block circuits comprises a plurality of transistors coupled between the supply voltage and a node within the NTC bias current generating circuit, wherein the NTC bias current generating circuit and the aforementioned each oscillator sub-block circuit share at least one transistor in the plurality of transistors.

At least one embodiment of the present invention provides an oscillator device comprising the above-mentioned oscillator circuit. The oscillator device further comprises a comparator coupled to at least one output terminal of the oscillator circuit, wherein the comparator is arranged to perform comparing operations in order to generate an output signal.

An advantage provided by the present invention is that: the oscillator circuit does not require a capacitor, and is temperature insensitive to the variation of temperature. More particularly, the oscillator circuit can achieve current reuse via component sharing. Compared with related art techniques, the oscillator circuit provided by the present invention can be implemented as a capacitor-less (cap-less) circuit, with sufficient functions and extremely compact size as well.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
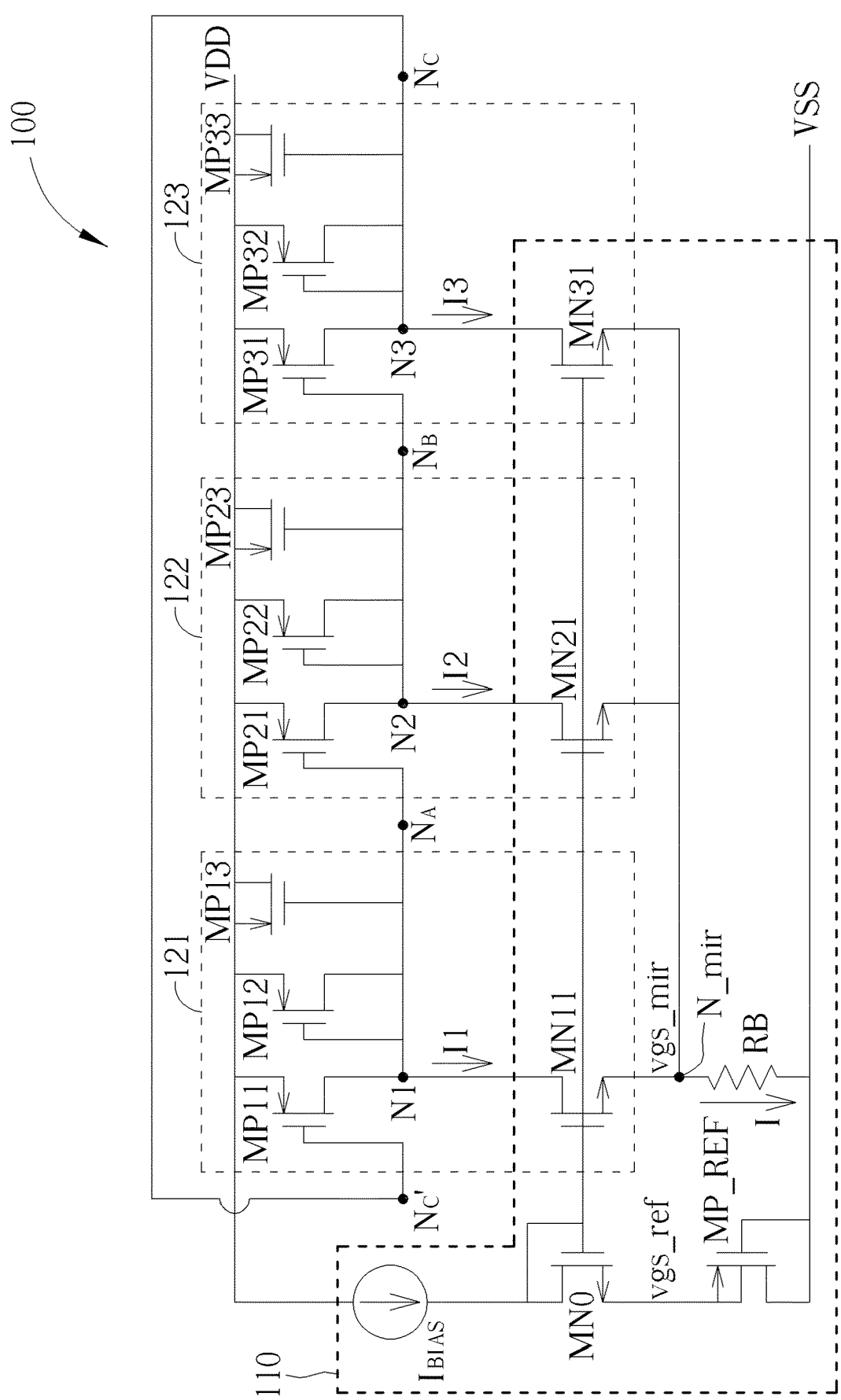
FIG. 1 is a diagram illustrating an oscillator circuit according to an embodiment of the present invention.

FIG. 1 is a diagram illustrating an oscillator circuit 100 according to an embodiment of the present invention. The oscillator circuit 100 comprises a negative-temperature-coefficient (NTC) bias current generating circuit 110 and a set of oscillator sub-block circuits {121, 122, 123}, wherein the NTC bias current generating circuit 110 is coupled between the supply voltage VDD the ground voltage VSS, and the set of oscillator sub-block circuits {121, 122, 123} are coupled to one another other to form an oscillator. The NTC bias current generating circuit 110 may generate at least one NTC bias current. Further, each oscillator sub-block circuit within the set of oscillator sub-block circuits {121, 122, 123} (e.g. the oscillator sub-block circuit 121, 122 or 123) may comprise a plurality of transistors that are coupled between the supply voltage VDD and the node N_mir within the NTC bias current generating circuit 110. More particularly, the NTC bias current generating circuit 110 and the aforementioned each oscillator sub-block circuit (e.g. the oscillator sub-block circuit 121, 122 or 123) share at least one transistor of the plurality of transistors (e.g. one or more transistors, such as the bottommost transistor of any oscillator sub-block circuit of the set of oscillator sub-block circuits {121, 122, 123}, i.e. the transistor MN11, MN21 or MN31). The architecture shown in FIG. 1 may comprise certain types of Metal Oxide Semiconductor Field Effect Transistors (MOSFETs), such as P-type and N-type MOSFETs, but the present invention is not limited thereto.

As shown in FIG. 1, the NTC bias current generating circuit 110 may comprise a current source which is coupled to the supply voltage VDD and generates the bias current $I_{BIAS}$, as illustrated at the upper-left of FIG. 1, and may comprise: a set of transistors {MN0, MP_REF} coupled between the aforementioned current source and the ground voltage VSS, transistors MN11, MN21 and MN31 coupled to the transistor MN0 (e.g. the transistors MN11, MN21 and MN31 may be taken as examples of the aforementioned at least one transistor), and the resistor RB coupled between the node N_mir and the ground voltage VSS, wherein the respective control terminals (e.g. the gate terminals) of the transistors MN11, MN21 and MN31 are coupled to two terminals (e.g. the gate terminal and the drain terminal) of transistor MN0 that belongs to the set of transistors {MN0, MP_REF}. In this embodiment, two terminals (e.g. the gate terminal and the drain terminal) of each transistor of the set of transistors {MN0, MP_REF} are coupled to each other, making the aforementioned each transistor (such as the transistors MN0 or MP_REF) be configured into a diode-connected transistor. For example, the set of transistors {MN0, MP_REF} may generate at least one reference voltage (e.g. one or more reference voltages, such as the voltage vgs_ref) according to the bias current $I_{BIAS}$, for performing NTC control, but the present invention is not limited thereto.

In addition, the plurality of transistors in the aforementioned each oscillator sub-block circuit (e.g. the oscillator sub-block circuit 121, 122 or 123) may comprise multiple transistors coupled between the supply voltage VDD and another node (e.g. the node N1, N2 or N3), and may comprise the aforementioned at least one transistor (e.g. the transistor MN11, MN21 or MN31) coupled between the other node (e.g. the node N1, N2 or N3) and the node N_mir. As shown in FIG. 1, the oscillator sub-block circuit 121 may comprise the transistors MP11, MP12 and MP13 that are coupled between the supply voltage VDD and the node N1, and may comprise the transistor MN11 that is coupled between the nodes N1 and N_mir. The oscillator sub-block circuit 122 may comprise the transistors MP21, MP22 and MP23 that are coupled between the supply voltage VDD and the node N2, and may comprise the transistor MN21 that is coupled between the nodes N2 and N_mir. The oscillator sub-block circuit 123 may comprise the transistors MP31, MP32 and MP33 that are coupled between the supply voltage VDD and the node N3, and may comprise the transistor MN31 that is coupled between the nodes N3 and N_mir. The oscillator sub-block circuits 121, 122 and 123 are coupled to one another, and more particularly, each oscillator sub-block circuit of them (e.g. the oscillator sub-block circuit 122, 123 or 121) may be controlled by the voltage (e.g. the voltage at the node $N_A$, $N_B$ or $N_C$) generated by a previous oscillator sub-block circuit (e.g. the oscillator sub-block circuit 121, 122 or 123). For example, the control terminal (such as the gate terminal) of the transistor MP21 in the oscillator sub-block circuit 122 is coupled to the node $N_A$ as well as the node N1 in the oscillator sub-block circuit 121; the control terminal (such as the gate terminal) of the transistor MP31 in the oscillator sub-block circuit 123 is coupled to the node $N_B$ as well as the node N2 in the oscillator sub-block circuit 122; and the control terminal (such as gate terminal) of the transistor MP11 in the oscillator sub-block circuit 121 is coupled to the nodes $N_C'$ and $N_C$ as well as the node N3 in the oscillator sub-block circuit 123. In this embodiment, two terminals of multiple terminals of each transistor of the transistors MP12, MP13, MP22, MP23, MP32 and MP33 are coupled to each other. For example, two terminals (such as the gate and drain terminals) of the multiple terminals of each transistor of the transistors MP12, MP22 and MP32 are coupled to each other, making this transistor be configured into a diode-connected transistor. In another example, two terminals (such as the source and drain terminals) of the multiple terminals of each transistor of the transistors MP13, MP23 and MP33 are coupled to each other, making this transistor be configured to have capacitive characteristics, for being utilized as a capacitor (such as a loading capacitor), but the present invention is not limited thereto.

Note that the NTC bias current generating circuit 110 and the set of oscillator sub-block circuits {121, 122, 123} may share current in order to achieve the goal of current-reusing. For example, the current I passing through the resistor RB may be equal to the summation of the current I1, I2 and I3. Further, the resistor RB may have the resistance RB (expressed with the same symbol in italics, for better understanding). Hence, the voltage vgs_mir at the node N_mir may be expressed as follows:

$$vgs\_mir = I*RB + VSS;$$

wherein when VSS=0 (V), it can be obtained that vgs_mir=I*RB, but the present invention is not limited thereto. In some embodiments, a specific value of RB that conforms to certain predetermined condition can be properly chosen, in order to make the NTC bias current generating circuit 110 have some associated characteristics.

According to this embodiment, the set of oscillator sub-block circuits {121, 122, 123} may be arranged to implement a ring oscillator with MOSFET as loading capacitor, and the ring oscillator is coupled to the NTC bias current generating circuit 110 and shares components with the NTC bias current generating circuit 110 in order to reach the goal of current-reusing, where the type of oscillators implemented according to the present invention is not limited to the ring oscillator only, but also covers other types of oscillators. Further, the oscillator circuit 100 has various excellent characteristics which are advantageous, such as current-reusing, NTC current biased oscillator, low-gain amplifier based oscillator, etc., and such excellent characteristics are not yet seen in related art techniques. To understand the present invention better, assume that the oscillator sub-block circuits {121, 122, 123} are identical to one another (i.e. any two of the three oscillator sub-block circuits are identical), and the oscillator frequency $f_{OSC}$ of the oscillator comprising the three oscillator sub-block circuits may be expressed as follows:

$$f_{OSC} = (1/Td\_Block\_1)/3;$$

wherein Td_Block_1 may represent the delay of the oscillator sub-block circuit 121. Since the oscillator sub-block circuit 121 is biased by the NTC bias current (e.g. the current I1), based on the compensation made with the characteristic that the NTC bias current is proportional to the opposite of temperature (e.g. the absolute temperature multiplied by −1) in the oscillator sub-block circuit 121, the oscillator sub-block circuit 121 will be temperature-insensitive. The above concept can be also applied to the oscillator sub-block circuits 122 and 123. From the aspect of process analysis, since the present invention avoids using capacitors, the gate capacitance variation of MOSFET is only about +/−5% over fast/slow corner. Hence, compared with other types of oscillators, the oscillator frequency $f_{OSC}$ is less sensitive to device corner.

Based on the architecture shown in FIG. 1, the present invention provides an oscillator circuit that avoids the use of capacitors and realizes a complete circuit architecture concurrently having various excellent characteristics such as current reused on-chip oscillator and NTC current biased oscillator without introducing a side effect, and achieves the goals that the circuit power consumption as well as the frequency drift with respect to variation of temperature in the present invention architecture are much less than that of the conventional architecture. More particularly, the capacitor-less oscillator circuit of the present invention can completely solve various problems encountered in related arts, wherein the novel architecture provided by the present invention is insensitive to temperature variation, and can realize current-reusing via sharing components, and can also greatly reduce frequency variations caused by some corner variations. Compared with related art techniques, the oscillator circuit of the present invention has sufficient functions and is extremely compact as well.

Figure 2:
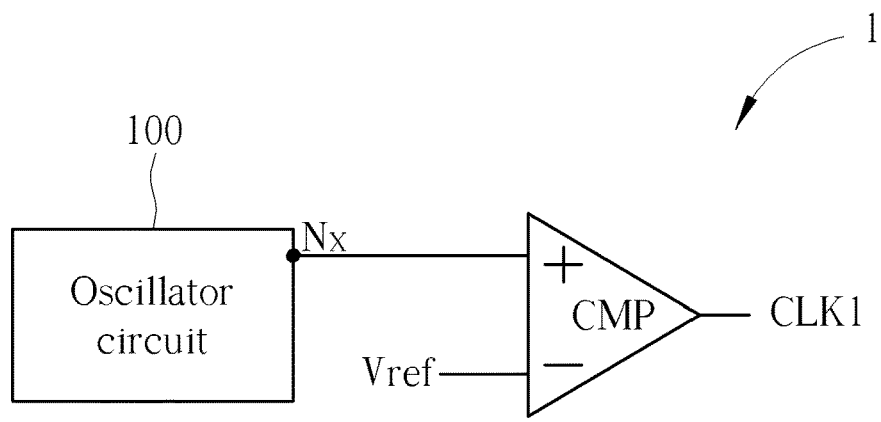
FIG. 2 is a diagram illustrating an oscillator device which comprises the oscillator circuit shown in FIG. 1 according to an embodiment of the present invention.

FIG. 2 is a diagram illustrating an oscillator device 10 which comprises the oscillator circuit 100 shown in FIG. 1 according to an embodiment of the present invention. The oscillator device 10 may further comprise a comparator (labeled "CMP"), which may be coupled to at least one output terminal of the oscillator circuit 100, such as the output terminal $N_X$, and may perform comparing operations (more particularly, comparing the voltage at the output terminal $N_X$ with a reference voltage such as voltage Vref) to generate the output signal CLK1, wherein the output terminal $N_X$ may be coupled to any of the nodes $N_A$, $N_B$ and $N_C$, and the output signal CLK1 may be utilized as a clock signal, but the present invention is not limited thereto.

Figure 3:
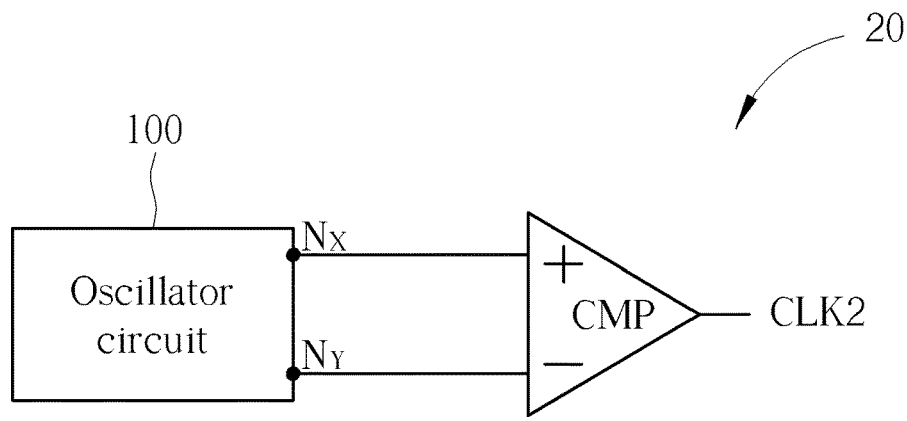
FIG. 3 is a diagram illustrating an oscillator device which comprises the oscillator circuit shown in FIG. 1 according to another embodiment of the present invention.

FIG. 3 is a diagram illustrating an oscillator device 20 which comprises the oscillator circuit 100 shown in FIG. 1 according to another embodiment of the present invention. The oscillator device 20 may further comprise the comparator (labeled "CMP"), which may be coupled to at least one output terminal of the oscillator circuit 100, such as output terminals $N_X$ and $N_Y$, and may perform comparing operations (more particularly, comparing the voltage at the output terminal $N_X$ with the voltage at the output terminal $N_Y$) to generate the output signal CLK2, wherein the output terminals $N_X$ and $N_Y$ may be coupled to any two of the nodes $N_A$, $N_B$ and $N_C$, respectively, and the output signal CLK2 may be utilized as a clock signal, but the present invention is not limited thereto.

Figure 4:
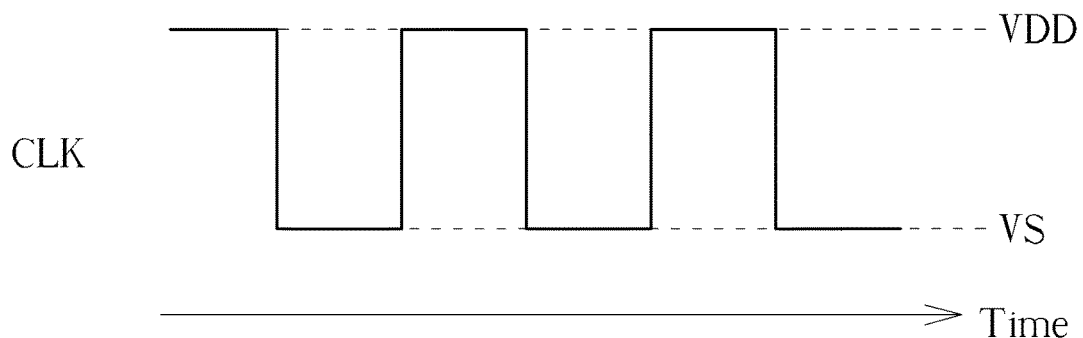
FIG. 4 illustrates an example of related signals of the oscillator circuit shown in FIG. 1.

FIG. 4 illustrates an example of related signals of the oscillator circuit 100 shown in FIG. 1. The signal CLK may represent the oscillation signal generated by any of the set of oscillator sub-block circuits {121, 122, 123}, wherein examples of the oscillation signal may include, but are not limited to: the voltage signal generated by the oscillator sub-block circuit 121 at the node $N_A$, the voltage signal generated by the oscillator sub-block circuit 122 at the node $N_B$, and the voltage signal generated by the oscillator sub-block circuit 123 at the node $N_C$. According to this embodiment, the voltage signals at the nodes $N_A$, $N_B$ and $N_C$ may be equal to the voltage signals at the nodes N1, N2 and N3, respectively, and may respectively oscillate between the supply voltage VDD and the voltage VS. For example, voltage VS may be expressed as follows:

$$VS = VDD - Vgs;$$

wherein Vgs may represent the reference voltage generated by a certain transistor (e.g. any of the transistors MP12, MP22 and MP32 that is configured into the diode-connected transistor), such as the amount of the gate-source voltage (the voltage difference between the gate and the source) of this transistor. In some embodiments, the voltages VDD, VSS, Vgs and VS may be equal to 3 (V), 0 (V), 0.7 (V) and 2.3 (V), respectively, but the present invention is not limited thereto.

The oscillator circuit (e.g. the oscillator circuit 100) and the oscillator devices (e.g. the oscillator devices 10 and 20) of the present invention may be applied to associated designs of various products, for example, the designs of analog intellectual property (IP) modules arranged for generating clocks, such as oscillator (OSC), phase-locked loop (PLL), etc. Compared with related art techniques, the oscillator circuit of the present invention is much more power-saving and insensitive to temperature and does not need capacitors, and more particularly, can realize current-reusing via component-sharing.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An oscillator circuit, comprising:
   a negative-temperature-coefficient (NTC) bias current generating circuit, coupled between a supply voltage and a ground voltage, the NTC bias current generating circuit arranged to generate at least one NTC bias current; and
   a set of oscillator sub-block circuits, coupled to one another to form an oscillator, wherein each oscillator sub-block circuit of the set of oscillator sub-block circuits comprises:
      a plurality of transistors, coupled between the supply voltage and a node within the NTC bias current generating circuit, wherein the NTC bias current generating circuit and said each oscillator sub-block circuit share at least one transistor in the plurality of transistors, and said each oscillator sub-block circuit is indirectly coupled to the ground voltage through the node within the NTC bias current generating circuit, rather than directly electrically connected to the ground voltage.

2. The oscillator circuit of claim 1, wherein the NTC bias current generating circuit comprises:
   a current source, coupled to the supply voltage, the current source arranged to generate a bias current; and
   a set of transistors, coupled between the current source and the ground voltage, the set of transistors arranged to generate at least one reference voltage according to the bias current, for performing NTC control.

3. The oscillator circuit of claim 2, wherein the NTC bias current generating circuit further comprises:
   said at least one transistor; and
   a resistor, coupled between the node and the ground voltage.

4. The oscillator circuit of claim 2, wherein a control terminal of said at least one transistor is coupled to two terminals of a transistor of the set of transistors.

5. The oscillator circuit of claim 1, wherein two terminals of each transistor of the set of transistors are coupled to each other to make said each transistor be configured into a diode-connected transistor.

6. The oscillator circuit of claim 1, wherein the plurality of transistors comprise:
   a first transistor, coupled between the supply voltage and another node;
   a second transistor, coupled between the supply voltage and said another node;
   a third transistor, coupled between the supply voltage and said another node; and
   said at least one transistor, coupled between said another node and the node.

7. The oscillator circuit of claim 6, wherein a control terminal of the first transistor is coupled to said another node of another oscillator sub-block circuit of the set of oscillator sub-block circuits.

8. The oscillator circuit of claim 6, wherein two terminals of multiple terminals of the second transistor are coupled to each other to make the second transistor be configured into a diode-connected transistor.

9. The oscillator circuit of claim 6, wherein two terminals of multiple terminals of the third transistor are coupled to each other, to make the third transistor be configured to having capacitive characteristics, for being utilized as a capacitor.

10. An oscillator device comprising the oscillator circuit of claim 1, wherein the oscillator device further comprises:
a comparator, coupled to at least one output terminal of the oscillator circuit, the comparator arranged to perform comparing operations in order to generate an output signal.

* * * * *